US007719908B1

(12) United States Patent
Tzou et al.

(10) Patent No.: US 7,719,908 B1
(45) Date of Patent: May 18, 2010

(54) MEMORY HAVING READ DISTURB TEST MODE

(75) Inventors: Joseph Tzou, Mountain View, CA (US); Suresh Parameswaran, Fremont, CA (US); Thinh Tran, Palo Alto, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 12 days.

(21) Appl. No.: 11/963,446

(22) Filed: Dec. 21, 2007

(51) Int. Cl.
*G11C 29/00* (2006.01)

(52) U.S. Cl. ............. 365/201; 365/189.07; 365/189.04; 365/185.07

(58) Field of Classification Search ................. 365/201, 365/189.07, 189.04, 185.07
See application file for complete search history.

(56) References Cited

U.S. PATENT DOCUMENTS

| | | | | |
|---|---|---|---|---|
| 5,539,699 A * | 7/1996 | Sato et al. ................... | 365/201 |
| 5,781,471 A * | 7/1998 | Kowshik et al. ......... | 365/185.07 |
| 6,498,755 B2 * | 12/2002 | Takahashi et al. ...... | 365/189.14 |
| 6,504,768 B1 * | 1/2003 | Roohparvar et al. ........ | 365/200 |
| 6,529,418 B2 * | 3/2003 | Nakai et al. ............ | 365/189.04 |
| 6,700,816 B2 * | 3/2004 | Takahashi et al. ...... | 365/185.07 |
| 6,707,714 B2 * | 3/2004 | Kawamura ............. | 365/185.11 |
| 7,257,762 B2 * | 8/2007 | Holm et al. ................. | 714/763 |
| 7,391,643 B2 * | 6/2008 | Fuji ........................... | 365/163 |
| 7,420,859 B2 * | 9/2008 | Nautiyal ..................... | 365/200 |
| 7,536,619 B2 * | 5/2009 | Satsukawa et al. .......... | 714/732 |

FOREIGN PATENT DOCUMENTS

JP          02001243798 A  *  9/2001

\* cited by examiner

*Primary Examiner*—Viet Q Nguyen (57) ABSTRACT

Embodiments of the invention relate to the testing and reduction of read disturb failures in a memory, e.g., an array of SRAM cells. A read disturb test mode may be added during wafer sort to identify any marginal memory cells that may fail read disturb, thus minimizing yield loss. The read disturb test mode may include first writing data to the memory. After a predetermined time period, the read disturb test mode reads data from the same memory, and compares the read data with the data previously written to the memory. A repair signal may be generated, when the read data is different from the data previously written to the memory. Additionally, a system may be implemented to reduce read disturb failures in the memory. The system may include a match logic circuit and a data selecting circuit. When a match condition is satisfied, data is read from a register that stores the previous written data, instead of from the memory. The match logic circuit may be selectively enabled or disabled.

18 Claims, 7 Drawing Sheets

FIG. 1
(Conventional)

Match Generation 500A

FIG. 5B

Data Selection 500B

MEMORY HAVING READ DISTURB TEST MODE

TECHNICAL FIELD

This disclosure relates generally to memories, and more particularly to the testing and reduction of read disturb failures in memories.

BACKGROUND

Figure 1:
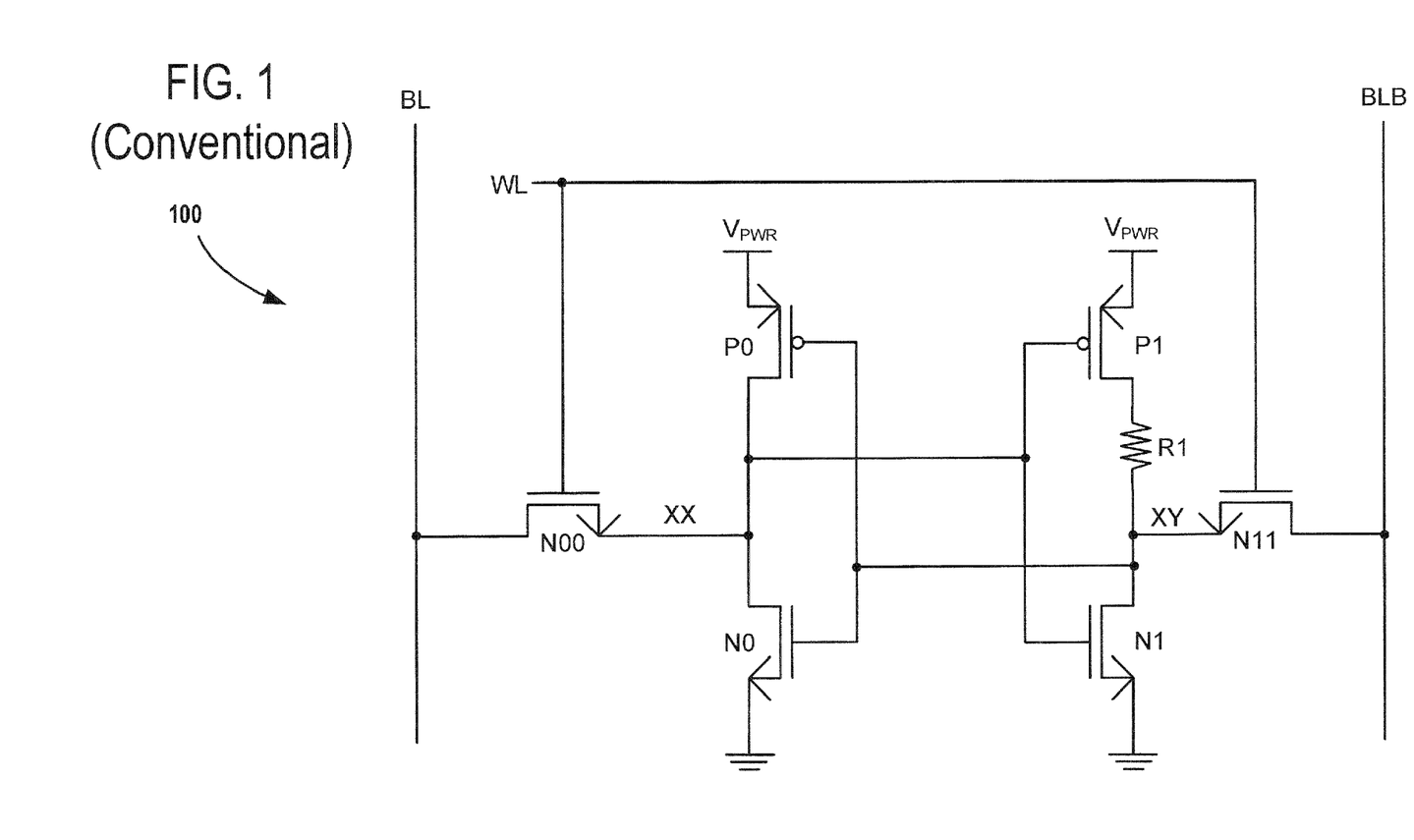
FIG. 1 is a block diagram illustrating a conventional CMOS SRAM cell.

FIG. 1 is a conventional CMOS SRAM cell 100. During write 0 access, in which 0 is written into cell 100, bit line BL is driven low, while bit line BLB is driven high. Due to process defects, it may take the node XY a relatively long time to charge to a desired voltage level by charging through a device P1 coupled with a resistor R1 (typically in the range of Mega ohms). If read access is performed soon after the write access, cell 100 may not yet be stabilized and may flip, thus causing the read to fail. This defective condition is referred to as "read disturb," which may cause yield loss during speed test for packaged devices.

Read disturb failure may not be easily captured at wafer sort, which is a test performed after an integrated circuit is produced but before it is packaged. This is because wafer sort is usually performed at relatively slow speed, which gives the SRAM cell node sufficient time to charge to a desired voltage level. But once the devices are packaged and subjected to speed test (e.g., read operations followed soon after a write operation), read disturb failure may occur, causing yield loss.

DESCRIPTION OF EXAMPLE EMBODIMENTS

Overview

A method for performing a read disturb test during wafer sort may include writing data to a memory; reading data from the memory after a predetermined time period following writing to the memory; comparing the data read from the memory to the data written to the memory; and generating an indicator responsive to the comparison. The indicator may comprise a repair signal or a pass signal. The read disturb test may perform at a speed independent of an external clock speed.

A system for reducing read disturb failure in a memory may include a match circuit to compare an address associated to a read access with an address associated with an immediately preceding write access, and to generate a match signal responsive to the comparison. The system may further include a data selecting circuit to select data from two or more locations depending on the match signal. The system may also include separate registers to store the write address and the data previously written into the memory. The system is selectively enabled or disabled.

DETAILED DESCRIPTION

Figure 2:
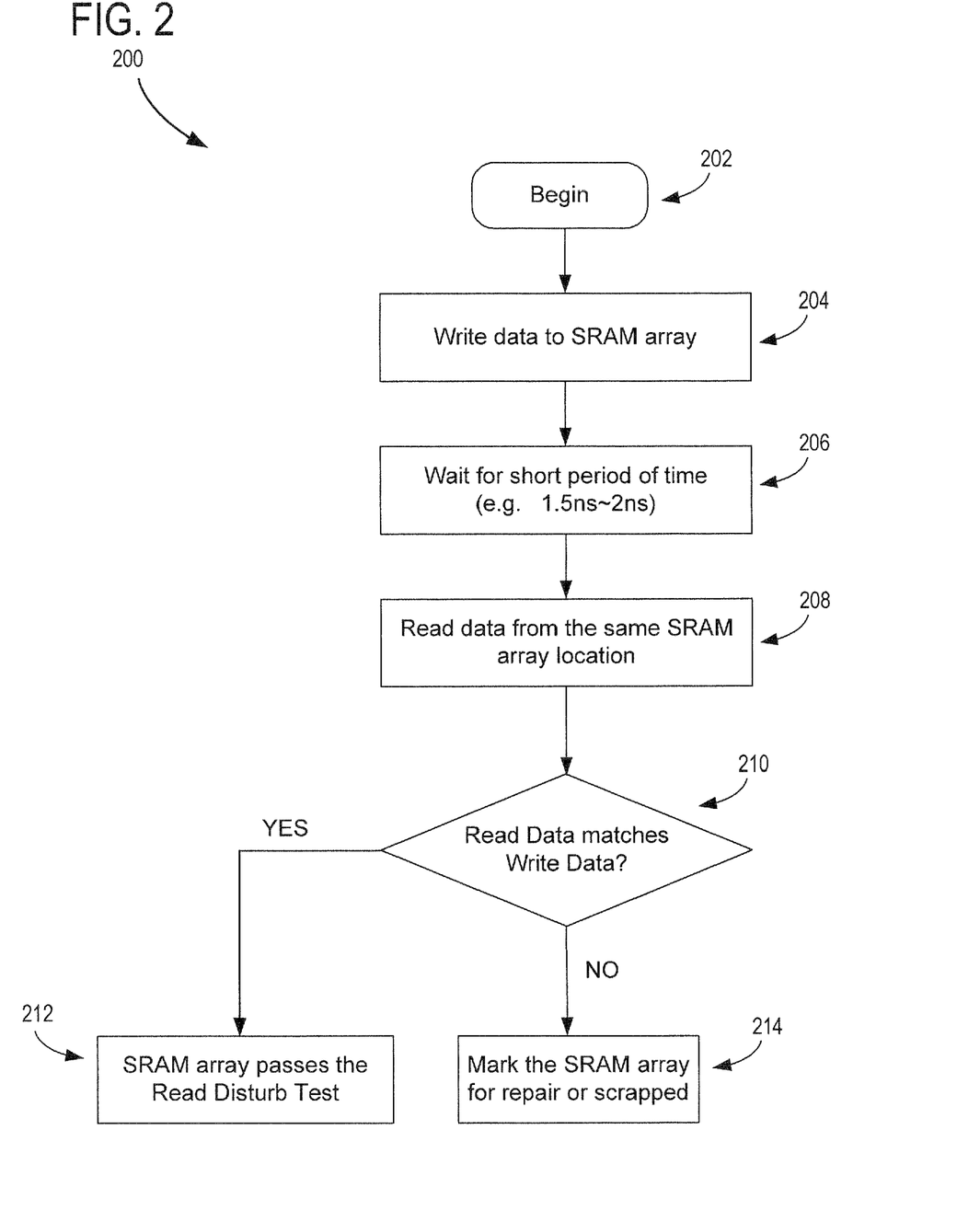
FIG. 2 is a flow diagram illustrating an example read disturb test mode according to embodiments of the invention.

FIG. 2 is a flow diagram illustrating an example read disturb test mode according to embodiments of the invention. The read disturb test mode 200 may be implemented during wafer sort to identify any memory devices that may fail read disturb.

Referring to FIG. 2, the read disturb test mode 200 begins at 202, e.g., during a read clock cycle. At 204, the read disturb test mode 200 writes the complement of a previously written data to a particular memory address. At 206, the read disturb test mode 200 waits for a predetermined period of time, e.g., about 1.5 ns to 2.0 ns. This predetermined period of time may be configurable. At 208, the read disturb test mode 200 performs a read access from the same SRAM array at the same address. At 210, the read disturb test mode 200 compares the data read from the SRAM array to the data previously written into the same SRAM array. If there is a match, then the SRAM array passes the read disturb test at 212, indicating that the SRAM array is unlikely to cause read disturb failure. Otherwise, at 214, the SRAM array fails the read disturb test, and may be marked for repair or scrapped.

As described earlier, wafer sort is usually performed at relatively slow speed using a slow tester. As such, it may be difficult to detect read disturb failure during wafer sort test. By implementing the read disturb test mode 200 during wafer sort, it is possible to capture any marginal SRAM cells at an earlier stage, thus reducing yield loss. It should be noted that the read disturb test mode 200 may be performed at a speed independent of external clock speed. The read disturb test mode 200 may be implemented in a control logic of the SRAM array, as will be discussed below with reference to FIG. 7.

Figure 3:
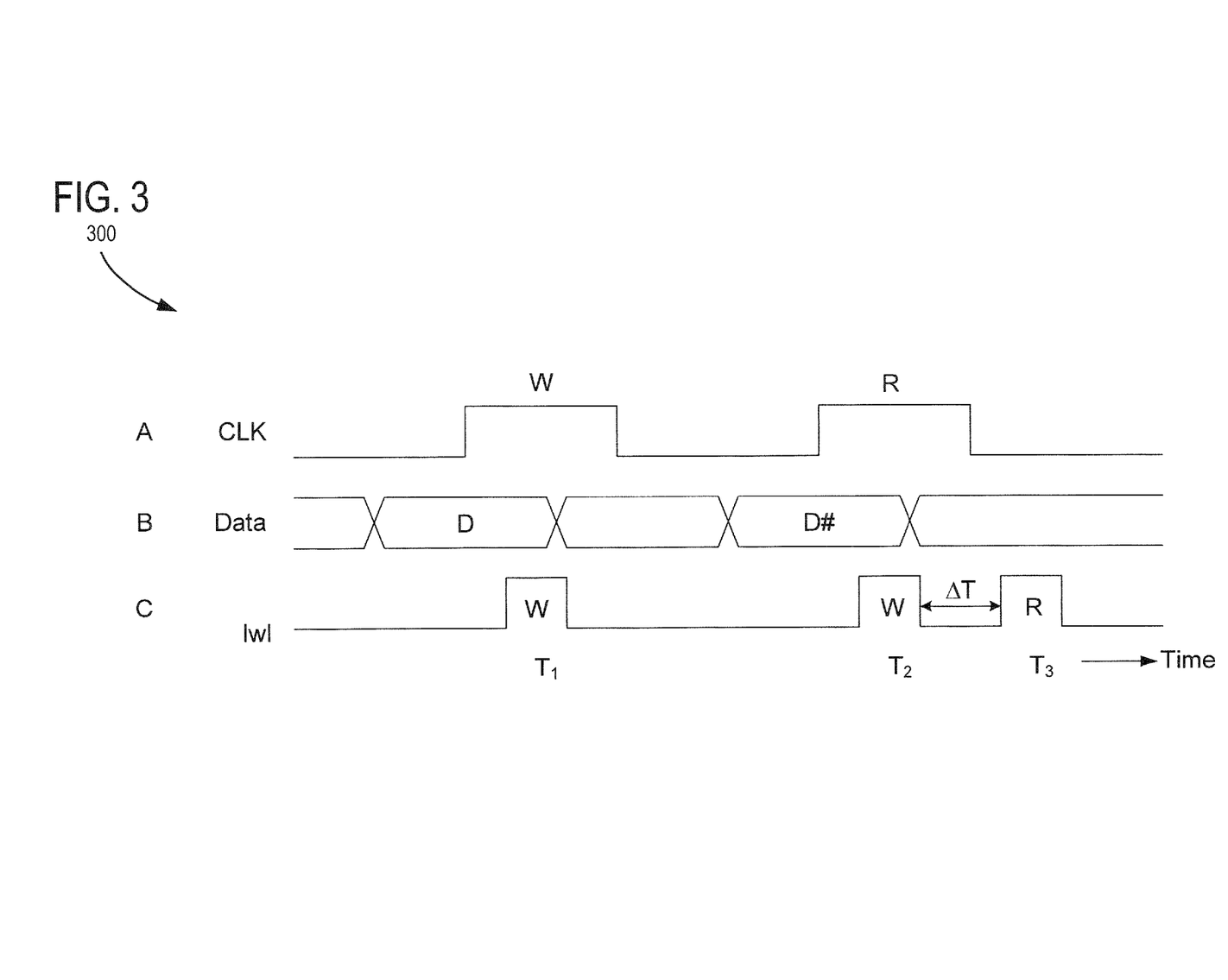
FIG. 3 is a timing diagram illustrating further details of the read disturb test mode of FIG. 2.

FIG. 3 is a timing diagram illustrating further details of the read disturb test mode of FIG. 2. Referring to FIG. 3, the waveform "A" represents external clock cycles, such as write and read cycles; "B" represents data to be written into or read from an SRAM array; "C" represents the self-timed local-word-line of the SRAM array.

During the write clock cycle, indicated as "W" in waveform "A", data D may be written into an SRAM array in a conventional manner at time T1 as shown in waveform "C". Subsequently, during the read clock cycle, indicated as "R" in waveform "A", data D#, which represents the complement of data D, may be written into the same SRAM array at time T2 (shown in waveform "C"). After a short time period of time ΔT, a read operation may be performed at time T3 (shown in waveform "C") for the same SRAM array. If the data read from the SRAM array at time T3 matches the data previously written to the SRAM array at time T2, then the SRAM array passes the read disturb test mode. Otherwise, the SRAM array fails the read disturb test.

Figure 4:
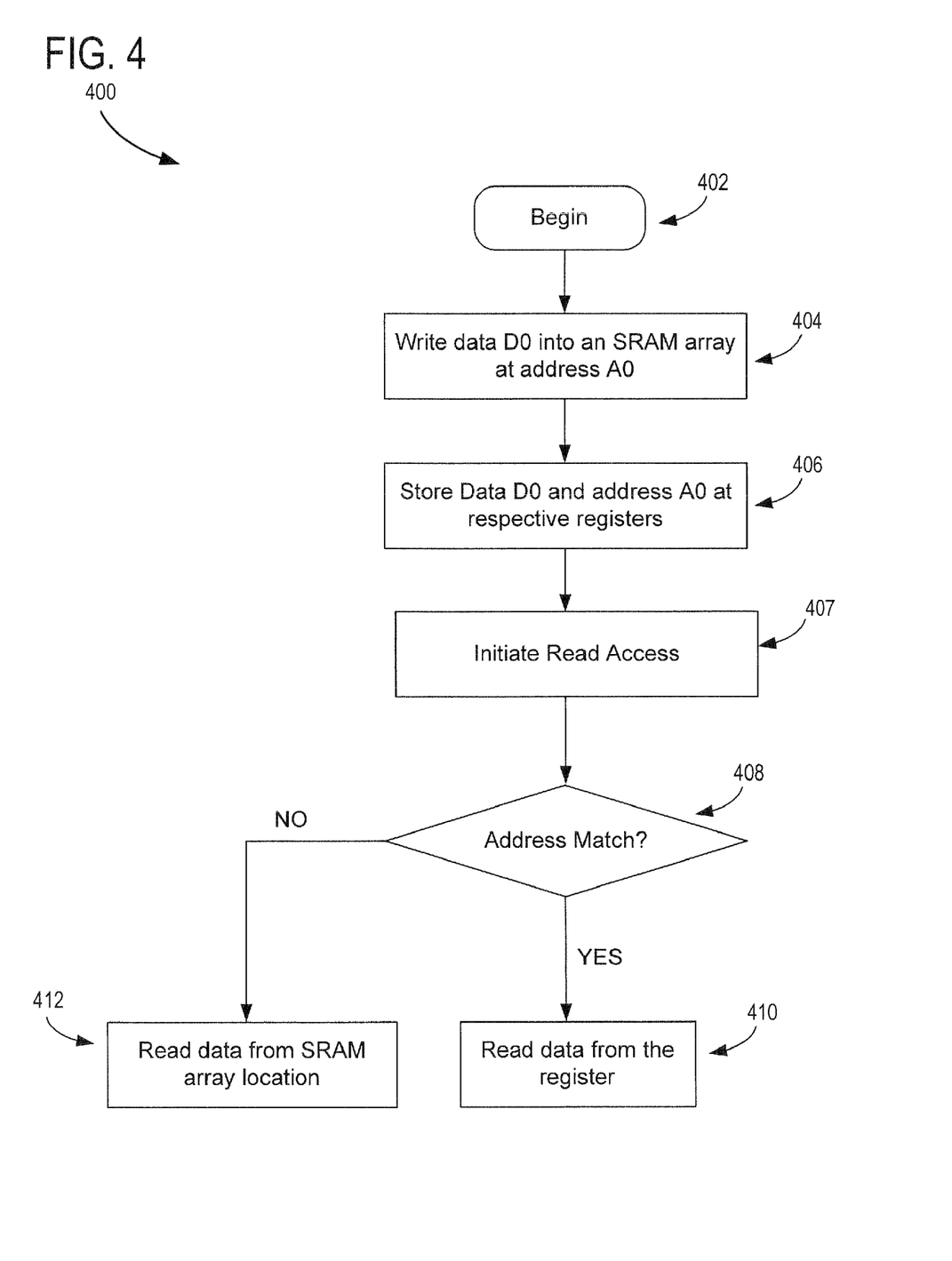
FIG. 4 is a flow diagram illustrating an example method to reduce read disturb failures according to embodiments of the invention.

FIG. 4 is a flow diagram illustrating an example method to reduce read disturb failures according to embodiments of the invention. Referring to FIG. 4, method 400 begins at 402. At 404, method 400 writes data D0 to an SRAM array at an address A0. At 406, method 400 stores data D0 and address A0 into respective registers. At 407, a read access is performed, which may be carried out in several steps. First at 408, method 400 detects whether a read address associated with the read access matches the address A0 that was stored in the corresponding register in process 406. If a match is found, at 410, method 400 reads data from the corresponding register in which data D0 is stored, instead of from the SRAM array. This eliminates read disturb failure. Otherwise, at 412, method 400 reads data from the SRAM array.

It should be noted that method 400 may be disabled during speed test of packaged devices so as to capture any marginal cells that may have escaped the above-described read disturb test mode during wafer sort, but may be activated when shipping final products to customers.

Figure 5A:
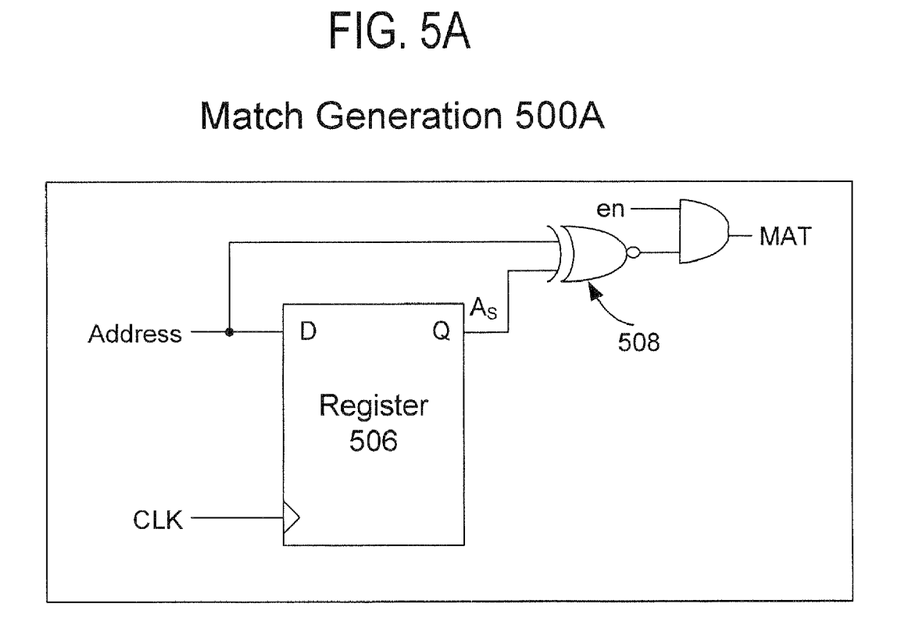
FIG. 5A is a block diagram illustrating an example match generation logic for the read disturb reduction method of FIG. 4.

FIG. 5A is a block diagram illustrating an example match generation logic for the read disturb reduction method of FIG. 4. Referring to FIG. 5A, logic 500A may include a register 506 and an exclusive-nor gate 508 for detecting a match between an address associated with a read access and an address associated with a previous write access. The register 506 stores the address associated with the write access, e.g., As=A0. Subsequently, a read access immediately following the write access may be performed. The exclusive-nor gate 508 compares the address associated with the read access with the address stored in the register 506 (i.e., address at the output Q or As), and generates a match signal "MAT" at its output to indicate whether there is a match between the addresses. Although it is shown that an exclusive-nor gate 508 is included in FIG. 5A, other logic gates may be used to perform the functions described.

An input signal "en" may be used to enable or disable the match logic 500A. In some embodiments, if "en" is set to 0, then logic 500A would be enabled to output a match signal "MAT", but would be disabled if "en" is set to 1. If logic 500A is enabled, e.g., "en"=1, and a match has been found between the addresses, the AND gate 508 would output a "1", indicating a match condition. Otherwise, the AND gate 508 would output a "0", indicating a no-match. This output signal "MAT" is then inputted to the data selection logic 500B of FIG. 5B, as will be described below.

An advantage of including the "en" signal in logic 500A allows for the flexibility to disable read disturb reduction during speed test of packaged devices so as to capture any marginal cells that may have escaped the read disturb test mode during wafer sort, and enable the read disturb reduction when shipping to the products to customers.

Figure 5B:
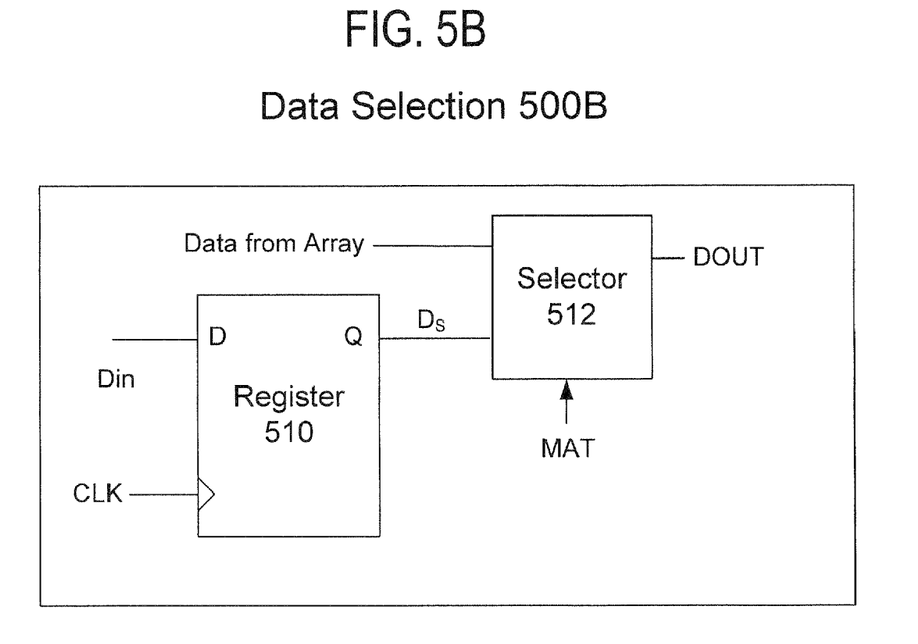
FIG. 5B is a block diagram illustrating an example data multiplexing logic for the read disturb reduction method of FIG. 4.

FIG. 5B is a block diagram illustrating an example data selection logic for the read disturb reduction method of FIG. 4. Referring to FIG. 5B, the data selection logic 500B may include a register 510 for storing data previously written into the SRAM array, e.g., Ds=Din. Logic 500B may additionally include a selector 512, e.g., a multiplexer, for selecting between the data stored in the register 510 and data stored in the SRAM array, based on the signal "MAT". If "MAT" is active, e.g., 1, then the selector 512 selects the data stored in the register 510 for output as DOUT. Otherwise, the selector 512 selects the data from the SRAM array as its output. The selected data is the data to be read during the read access.

Figure 6:
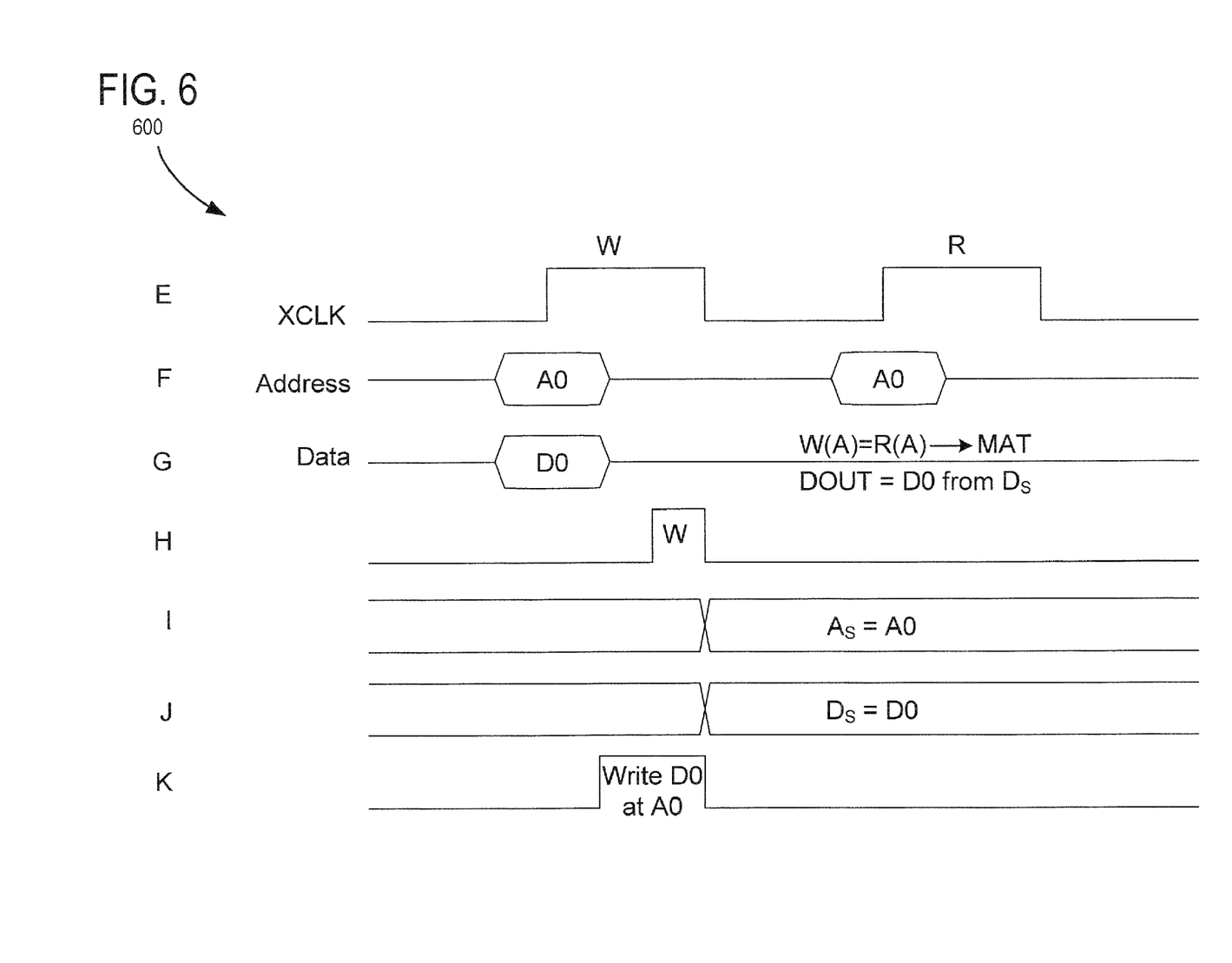
FIG. 6 is a timing diagram illustrating further details of the read disturb reduction method of FIG. 4.

FIG. 6 is a timing diagram illustrating further details of the read disturb reduction method of FIG. 4. Referring to FIG. 6, waveform "E" illustrates external clock cycles, such as write and read cycles; waveform "F" illustrates the addresses associated with the read and write accesses; waveform "G" illustrates data to be written into or read from a SRAM array; waveform "H" illustrates the internal write-clock; waveform "I" illustrates an operation of the register 506 of FIG. 5A; waveform "J" illustrates an operation of the register 510 of FIG. 5B; waveform "K" illustrates the self-timed Local-Word-Line of the SRAM array.

In operation of the SRAM array during the write clock cycle, indicated as "W" in waveform "E", data D0 may be written into address A0 in a conventional manner as shown in waveform "K". At the internal write-clock, indicated as "W" in waveform "H", register 506 of FIG. 5A writes address A0 to its output Q, such that As =A0 (shown in waveform "I"). Likewise, register 510 of FIG. 5B writes data D0 to its output Q, such that Ds=D0 (shown in waveform "J"). Subsequently, during the read clock cycle, indicated as "R" in waveform "E", a read access is performed. If the match logic 500A of FIG. 5A is enabled, then the match logic detects whether the address associated with the read access is the same as the address of the write access stored in the register 506 and outputs a match signal "MAT". If a match is found, such as in the example illustrated in FIG. 6, then data will be read from the corresponding register in which data D0 is stored, such as register 510 of FIG. 5B. Otherwise, data is read from the SRAM array.

Figure 7:
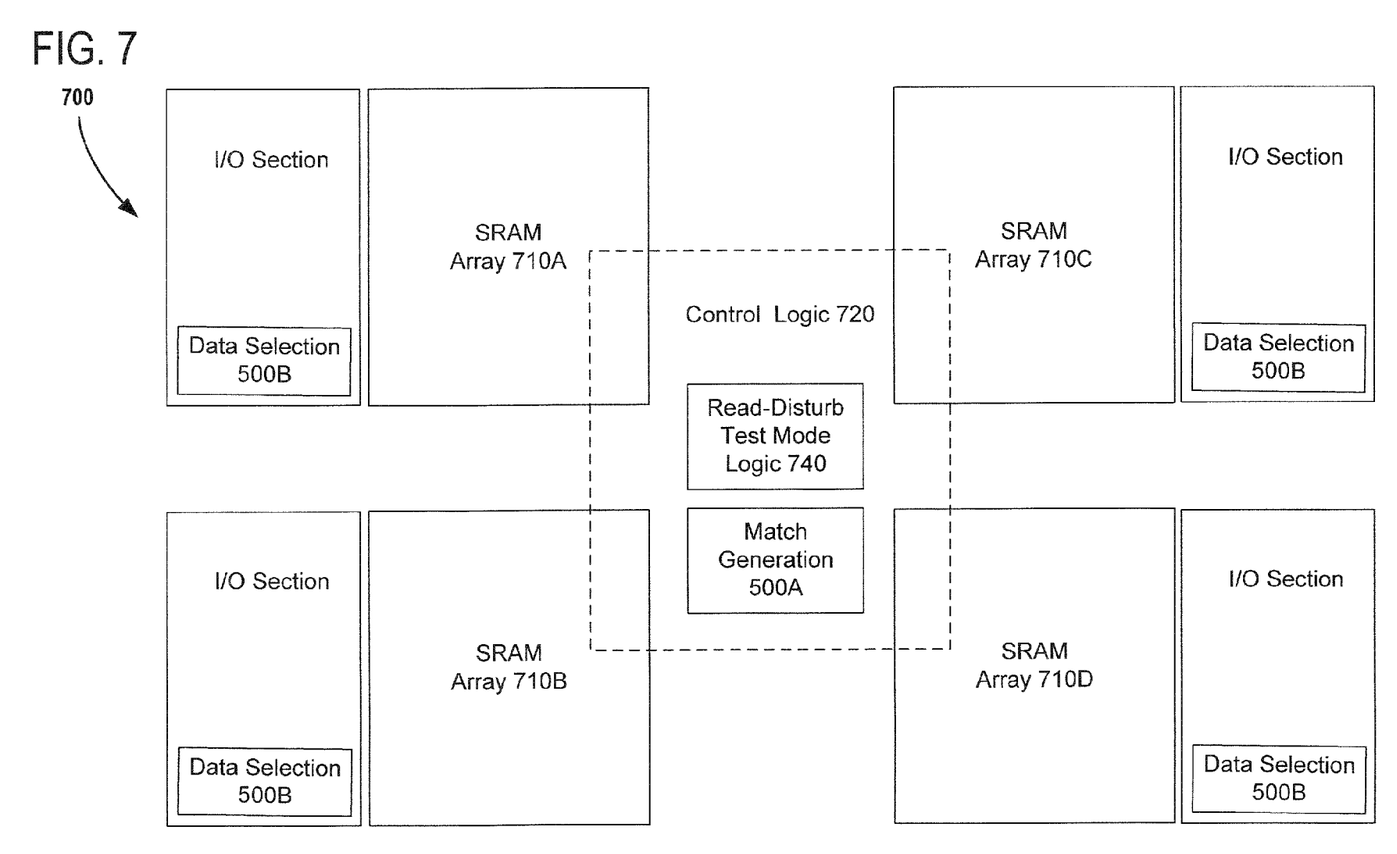
FIG. 7 is an example memory system according to embodiments of the invention.

FIG. 7 is an example memory system 700 including a plurality of SRAM arrays. Referring to FIG. 7, memory system 700 may include a plurality of SRAM arrays 710A, 710B, 710C, and 710D. Memory system 700 may include any number of SRAM arrays.

Memory system 700 may include control logic 720, which may implement address logic (not shown), as would be known to those of ordinary skill in the art. The control logic 720 may additionally implement match generation logic 500A, as explained above with reference to FIG. 5A. The control logic 720 may also include a read disturb test mode logic 740 implementing the read disturb test mode 200 discussed earlier. The read disturb test mode logic 740 may implement the functionality of the read disturb test mode 200 as discussed above. Additionally, data selection logic 500B may be implemented in the I/O section of the SRAM array 710A, 710B, 710C, and 710D to select the appropriate data output.

Further modifications and alternative embodiments of this invention will be apparent to those skilled in the art in view of this description. Accordingly, this description is to be construed as illustrative only and is for the purpose of teaching those skilled in the art the manner of carrying out the invention. Alternative embodiments are contemplated and are within the spirit and scope of the following claims.

Various changes may be made in the shape, size and arrangement and types of components or devices. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. A system, comprising:
   read-disturb reduction logic, including:
   a match circuit configured to compare an address associated to a read access with an address associated with a write access, and to generate a match signal responsive to the comparison;
   a data selecting circuit configured to select data from two or more data storage locations depending on the match signal; and
   read-disturb test mode logic configured to identify read disturb failures during wafer sort.

2. The system of claim 1, wherein the match circuit includes:
   a register to store the address associated with the write access; and
   a logic gate to output the match signal when the address associated with the read access matches the address associated with the write access.

3. The system of claim 1, wherein the data selecting circuit includes:
   a register to store data written into a memory element; and
   a multiplexer.

4. The system of claim 1, wherein the read disturb reduction logic is selectively enabled.

5. The system of claim 1, wherein the match circuit is selectively enabled.

6. The system of claim 3, wherein the memory element is an array of SRAM cells.

7. The system of claim 1, wherein the two or more data storage locations comprises at least a register.

8. The system of claim 3, wherein the match circuit is implemented in a control logic portion of the memory element.

9. The system of claim 3, wherein the data selecting circuit is implemented in an I/O section of the memory element.

10. A method, comprising:
    comparing at a match circuit an address associated to a read access with an address associated with a write access;
    generating a match signal responsive to the comparing;
    selecting data at a data selecting circuit from two or more data storage locations depending on the match signal; and
    identifying read disturb failures during wafer sort using read-disturb test mode logic.

11. The method of claim 10, wherein the match circuit includes:
    a register to store the address associated with the write access; and
    a logic gate to output the match signal when the address associated with the read access matches the address associated with the write access.

12. The method of claim 10, wherein the data selecting circuit includes:
    a register to store data written into a memory element; and
    a multiplexer.

13. The method of claim 10, wherein the comparing and generating are selectively enabled.

14. The method of claim 10, wherein the match circuit is selectively enabled.

15. The method of claim 12, wherein the memory element is an array of SRAM cells.

16. The method of claim 10, wherein the two or more data storage locations comprises at least a register.

17. The method of claim 12, wherein the match circuit is implemented in a control logic portion of the memory element.

18. The method of claim 12, wherein the data selecting circuit is implemented in an I/O section of the memory element.

* * * * *